United States Patent
Fisher-Jeffes et al.

(10) Patent No.: US 12,261,616 B2
(45) Date of Patent: Mar. 25, 2025

(54) NOISE SHAPING IN DIGITAL-TO-ANALOG CONVERTERS USING RANDOMIZING ENCODERS

(71) Applicant: MEDIATEK Singapore Pte. Ltd., Singapore (SG)

(72) Inventors: Timothy Perrin Fisher-Jeffes, Cambridge (GB); Nathan Egan, Burlington, MA (US)

(73) Assignee: MEDIATEK SINGAPORE PTE. LTD., Singapore (SG)

(*) Notice: Subject to any disclaimer, the term of this patent is extended or adjusted under 35 U.S.C. 154(b) by 197 days.

(21) Appl. No.: 18/134,469

(22) Filed: Apr. 13, 2023

(65) Prior Publication Data
US 2023/0412184 A1    Dec. 21, 2023

Related U.S. Application Data

(60) Provisional application No. 63/353,936, filed on Jun. 21, 2022.

(51) Int. Cl.
    *H03M 1/06* (2006.01)
(52) U.S. Cl.
    CPC ....... *H03M 1/0668* (2013.01); *H03M 1/0673* (2013.01)
(58) Field of Classification Search
    CPC .... H03M 1/05; H03M 1/0668; H03M 1/0673; H03M 1/747; H03M 1/0863; H03M 1/0604; H03M 1/662
    See application file for complete search history.

(56) References Cited

U.S. PATENT DOCUMENTS

| 4,994,803 | A  | * | 2/1991  | Blackham | H03M 1/0641 341/131 |
| 5,703,587 | A  | * | 12/1997 | Clark    | H03M 1/68 341/145   |
| 5,844,509 | A  | * | 12/1998 | Behrens  | G11B 20/10 341/58   |
| 6,466,147 | B1 | * | 10/2002 | Jensen   | H03M 1/0673 341/143 |
| 6,587,977 | B1 | * | 7/2003  | Riggle   | H03M 5/145 714/701  |

(Continued)

*Primary Examiner* — Lam T Mai
(74) *Attorney, Agent, or Firm* — McClure, Qualey & Rodack, LLP

(57) ABSTRACT

Techniques for compensating high-speed digital-to-analog converters (DACs) for static mismatch are described. In ideal circumstances, the current sources of a DAC are identical to each other, leading to a frequency response presenting a relatively flat noise spectrum. In the presence of mismatch, however, the response creates unwanted spurious content, which can negatively affect the DAC's dynamic range. The techniques described herein involve randomized thermometric encoders. First, the direction in which a packet contracts or expands, depending on the value to be encoded, can be randomized. Second, pairs of values in a packet (and/or pairs of values outside the packet) can be swapped with one another in a randomized fashion. Third, the decision of whether to apply randomization or not can itself be randomized. By applying one or more of the randomization techniques described herein, the negative effects of switch timing offset and errors in DC linearity can be mitigated.

20 Claims, 4 Drawing Sheets

(56) References Cited

U.S. PATENT DOCUMENTS

| | | | | |
|---|---|---|---|---|
| 6,617,989 B2* | 9/2003 | Deak | ............... | H03M 1/682 |
| | | | | 341/154 |
| 6,714,144 B1* | 3/2004 | Reed | ............... | G11B 20/10009 |
| | | | | 341/50 |
| 6,867,721 B1* | 3/2005 | Lin | ............... | H03M 1/0673 |
| | | | | 341/150 |
| 8,027,371 B2* | 9/2011 | Fisher-Jeffes | ............... | H04B 1/7115 |
| | | | | 375/150 |
| 8,027,375 B2* | 9/2011 | Fisher-Jeffes | ............... | H04B 1/7117 |
| | | | | 375/150 |
| 2002/0121995 A1* | 9/2002 | Tabler | ............... | H03M 1/0602 |
| | | | | 341/145 |
| 2016/0094235 A1 | 3/2016 | Kuttner et al. | | |
| 2016/0211861 A1* | 7/2016 | Op 'T Eynde | ............... | H03M 1/1038 |
| 2016/0365870 A1* | 12/2016 | Huang | ............... | H03M 3/464 |
| 2018/0006661 A1* | 1/2018 | Huang | ............... | H03M 3/422 |
| 2019/0165820 A1* | 5/2019 | Xu | ............... | H03M 3/502 |
| 2020/0028519 A1* | 1/2020 | Hsiao | ............... | H03M 1/067 |
| 2022/0271771 A1* | 8/2022 | Zheng | ............... | H03M 1/68 |
| 2024/0113727 A1* | 4/2024 | Egan | ............... | H03M 1/742 |

\* cited by examiner

NOISE SHAPING IN DIGITAL-TO-ANALOG CONVERTERS USING RANDOMIZING ENCODERS

CROSS REFERENCE TO RELATED APPLICATIONS

This Application claims priority under 35 U.S.C. § 119(e) to U.S. Provisional Application No. 63/353,936, entitled "MINIMUM SHUFFLE TO ACHIEVE NOISE SHAPING" filed on Jun. 21, 2022, which is herein incorporated by reference in its entirety.

BACKGROUND

Digital-to-analog converters are electronic circuits that convert digital data into analog signals. Digital-to-analog converters are commonly used in audio and video applications, such as in music players to convert digital audio streams into the analog audio signals and in displays to convert digital video streams into analog video signals. Further, digital-to-analog converters are used extensively in modern communication systems. For example, ultra-high-speed converters are commonly used in fiber optics.

BRIEF SUMMARY

Some embodiments relate to a method for performing digital-to-analog conversion (DAC), comprising: receiving an input digital word; encoding at least a portion of the input digital word using a randomizing encoder, wherein the randomizing encoder comprises a plurality of outputs coupled to a plurality of DAC units, a state of each of the plurality of outputs being set by a corresponding entry of a control block, and wherein encoding at least a portion of the input digital word comprises: generating a packet by setting at least some of the entries of the control block, wherein setting at least some of the entries comprises setting a width of the packet based on a value represented by the at least a portion of the input digital word; and modifying the packet based on a change in the value represented by the at least a portion of the input digital word, wherein modifying the packet comprises varying the width of the packet either in a first direction or a in second direction depending on a random number or a pseudo random number; and controlling the plurality of DAC units based on the packet at a first time interval, and controlling the plurality of DAC units based on the modified packet at a second time interval subsequent the first time interval.

Some embodiments relate to a system for performing digital-to-analog conversion (DAC), comprising: a plurality of DAC units; and a randomizing encoder comprising a plurality of outputs coupled to the plurality of DAC units, a state of each of the plurality of outputs being set by a corresponding entry of a control block, wherein the randomizing encoder is configured to: receive an input digital word; encode at least a portion of the input digital word by: generating a packet by setting at least some of the entries of the control block, wherein setting at least some of the entries comprises setting a width of the packet based on a value represented by the at least a portion of the input digital word; and modifying the packet based on a change in the value represented by the at least a portion of the input digital word, wherein modifying the packet comprises varying the width of the packet either in a first direction or a in second direction depending on a random number or a pseudo random number; and control the plurality of DAC units based on the packet at a first time interval, and control the plurality of DAC units based on the modified packet at a second time interval subsequent the first time interval.

Some embodiments relate to a method for performing digital-to-analog conversion (DAC), comprising: receiving an input digital word; encoding at least a portion of the input digital word using a randomizing encoder, wherein the randomizing encoder comprises a plurality of outputs coupled to a plurality of DAC units, a state of each of the plurality of outputs being set by a corresponding entry of a control block, and wherein encoding at least a portion of the input digital word comprises: generating a packet by setting at least some of the entries of the control block, wherein setting at least some of the entries comprises setting a width of the packet based on a value represented by the at least a portion of the input digital word; and modifying the packet based on a change in the value represented by the at least a portion of the input digital word, wherein modifying the packet comprises swapping a first entry of the packet with a second entry of the packet; and controlling the plurality of DAC units based on the packet at a first time interval, and controlling the plurality of DAC units based on the modified packet at a second time interval subsequent the first time interval.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

I. Overview

Figure 1:
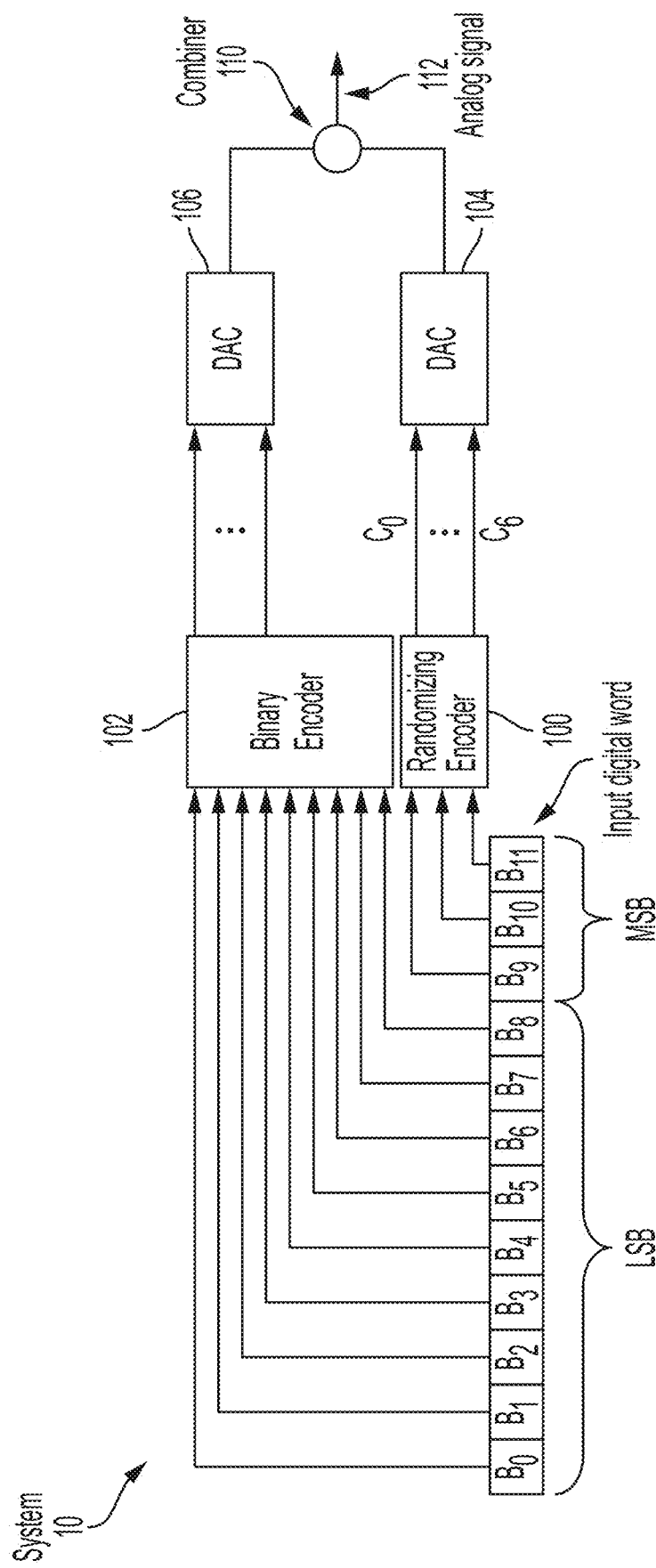
FIG. 1 is a block diagram illustrating a system for performing digital to analog conversion including a randomizing encoder, in accordance with some embodiments of the technology described herein.

Described herein are techniques for compensating high-speed digital-to-analog converters (DACs) for static mismatch (e.g., timing offsets arising in the switches of a DAC). In ideal circumstances, the current sources of a DAC are identical to each other, leading to a frequency response presenting a relatively flat noise spectrum. In the presence of mismatch, however, the response presents unwanted spurious content, which can negatively affect the DAC's dynamic range. Mismatch can occur because of inevitable variations arising in fabrication processes as well as temperature gradients. Such reductions in the dynamic range are particularly problematic in high-speed DACs, for example, DACs configured to handle data rates in the giga-samples-per-second (GSa/s) range, where the dynamic range requirements are particularly strict. The techniques developed by the inventors and described herein are configured to shift the spurious content created by static errors towards lower frequencies-away from the bandwidth of interest. As a result, the bandwidth of interest is affected by spurious content to a lesser extent and the overall dynamic range is increased.

The techniques described herein involve randomizing thermometric encoders. In current steering DACs, a thermometric encoder is arranged so that its entries dictate which current sources are to drive electric current—thereby contributing to the analog output—and which current sources are not to drive electric current. It should be noted, however, that the techniques described herein are not limited to current steering DACs, and could be applied to other types of DACs, such as voltage mode or a charge mode DAC. Thus, not all thermometric encoders involve current sources. For the sake of illustration, the following examples are described as providing current steering.

The entries of a thermometric encoder are set on the basis of the input digital word. In some embodiments, one or more aspects of a thermometric encoder are randomized. To that end, the inventors have recognized and appreciated that the negative effects resulting from DC linearity errors or switch timing offset can be mitigated by randomizing the mismatch. In a thermometric encoder, there are multiple codes that can represent the same numeric value. By randomizing the selection of the code used to represent one particular value, mismatch among the DAC segments are distributed among several codes, as opposed to being concentrated on a few particular codes, thereby improving the overall performance of a DAC. It should be noted that not all the bits to be digitized need to be encoded in this manner. In some embodiments, only a first portion of an input digital word (e.g., the most significant bits) are encoded in accordance with a randomized process of the types described herein.

The value represented by the most significant bits may modulate the width of a "packet" in a bit string. A bit string includes bits indicating whether a current source is to drive current or not. For each current source, there is a corresponding bit in the bit string. A packet of the types described herein is constructed so that bits of the bit string located inside the packet lead to current sources driving current, and bits of the bit string located outside the packet lead to current sources not driving current (or vice versa). Several aspects of a packet can be randomized, as detailed below.

First, the direction in which a packet contracts or expands, depending on the value to be encoded, can be randomized. For example, if the value to be encoded changes from 2 to 4, the packet undergoes a corresponding expansion by two elements either toward the left of the bit string or toward the right in a randomized fashion. Whether the packet contacts/expands toward the left or toward the right may be selected based on a random number or pseudo-random number.

Second, pairs of values in a packet (and/or pairs of values outside the packet) can be swapped with one another in a randomized fashion. The rationale behind the randomized swapping is that, for purposes of the digital-to-analog conversion of a particular input string, it does not matter which particular current sources drive current, so long as the overall number of current sources that drive current remains constant. What drives this randomization process is the input data itself, as opposed to a random number or pseudo random number. In some embodiments, which bits are swapped may be dictated by the present value represented by the most significant bits relative to the previous value.

Third, the decision of whether to apply randomization or not can itself be randomized. This randomization can be made on the basis of the same pseudo-random number described above.

By applying one or more of the randomization techniques described herein, the negative effects resulting from switch timing offset or DC mismatch can be mitigated.

II. Randomizing Encoders

FIG. 1 is a block diagram illustrating a system for performing digital to analog conversion including a randomizing encoder, in accordance with some embodiments of the technology described herein. System 10 is configured to receive and convert an input digital word to the analog domain. As a result, analog signal 112 is an analog representation of the value originally represented by the digital input word. In this example, the digital input word includes 12 bits ($B_0$, $B_1$, $B_2$, $B_3$, $B_4$, $B_5$, $B_6$, $B_7$, $B_8$, $B_9$, $B_{10}$ and $B_{11}$). However, system 10 is not limited to input bit words of any particular length. Bits $B_0$-$B_8$ can be viewed as the least significant bits (LSB) of the input digital word, and bits $B_9$-$B_{11}$ can be viewed as the most significant bits (MSB) of the input digital word. However, not all embodiments are limited to this particular way to group LSB and MSB. The bits corresponding to the MSB subset are encoded using randomizing encoder 100. The bits corresponding to the LSB subset may be encoded using binary encoder 102, but could equally be encoded with a second or even third randomizing encoder the same as described within or another. The outputs of randomizing encoder 100 ($c_0 \ldots c_6$) are provided as inputs to DAC 104 and the outputs of binary encoder 102 (not labeled in FIG. 1) are provided as inputs to DAC 106. Combiner 110 combines the analog outputs of the DACs together, for example additively, to produce analog signal 112.

The following figures relate to DAC 104 and randomizing encoder 100. DAC 106 may be implemented similar to DAC 104. Binary encoder 102 may be implemented in any suitable way.

Figure 2:
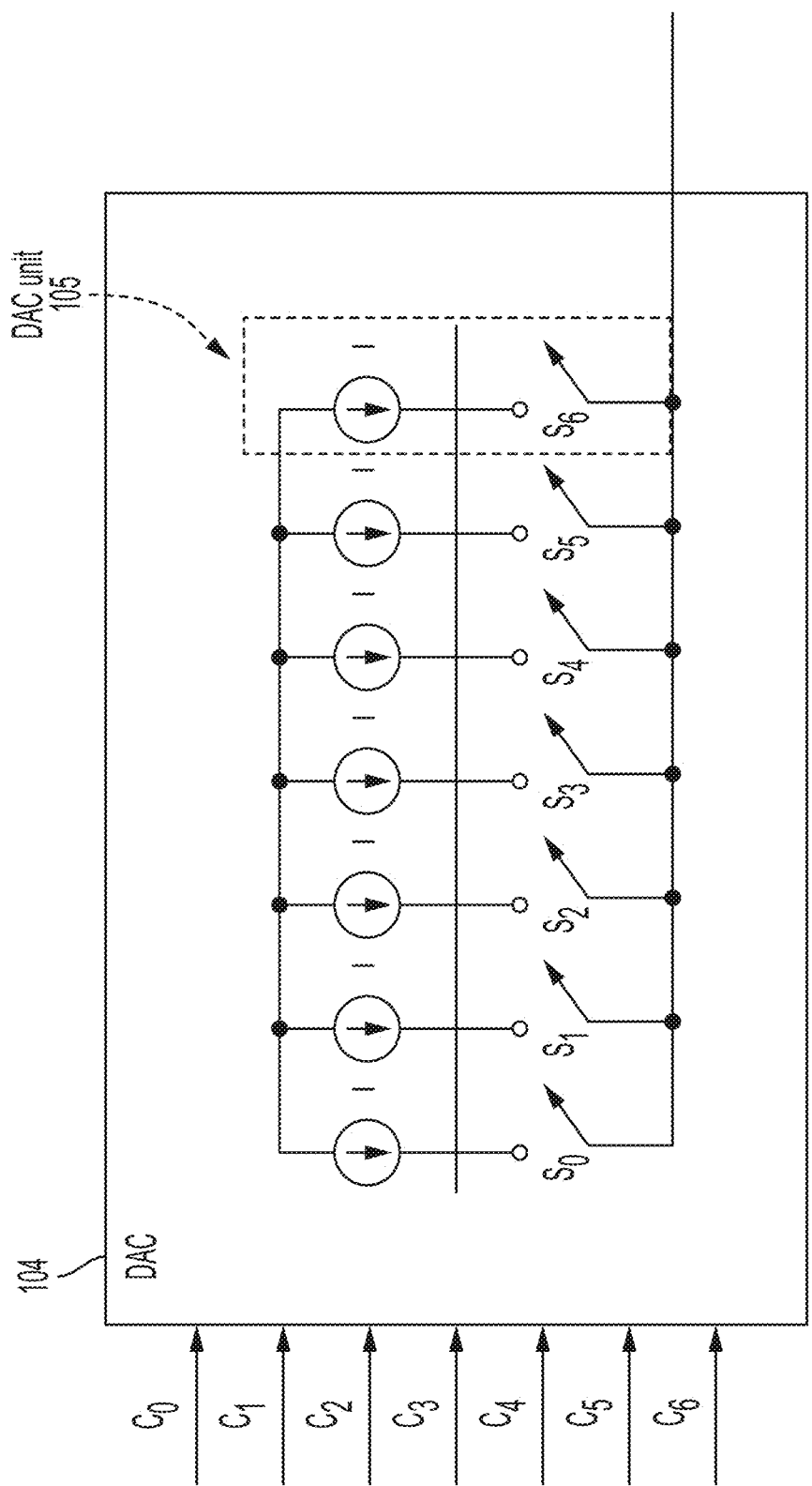
FIG. 2 is a block diagram illustrating a digital-to-analog converter (DAC) of the system of FIG. 1 in additional detail, in accordance with some embodiments of the technology described herein.

FIG. 2 is a block diagram illustrating DAC 104 in additional detail. DAC 104 includes multiple DAC units 105. Each DAC unit 105 includes a current source (I) and a switch ($S_0$, $S_1$, $S_2$, $S_3$, $S_4$, $S_5$ and $S_6$) coupled in series with the current source. When a switch is closed, the current of the corresponding source passes through it, thus contributing to the overall output of DAC 104. By contrast, when a switch is open, the current of the corresponding source is blocked, thus not contributing to the overall output of DAC 104. The state of each switch is controlled independently of the other switches. Nominally, the current sources may be arranged to be matched (to produce the same current I). In practice, mismatch may occur, for example due to inevitable variations arising in fabrication processes or temperature gradients. Therefore, the currents produced by the various sources may differ from each other, at least to some extent.

DAC 104 receives as inputs the bits generated by randomizing encoder 100 ($C_0$, $C_1$, $C_2$, $C_3$, $C_4$, $C_5$ and $C_6$). At each moment in time, each bit $C_i$ (i=0, 1, 2, 3, 4, 5 or 6) controls the state of a corresponding switch $S_k$ (i=0, 1, 2, 3, 4, 5 or 6). However, which bit controls which switch varies over time as discussed in detail below. Collectively, bits $C_0$, $C_1$, $C_2$, $C_3$, $C_4$, $C_5$ and $C_6$ are referred to herein as a "control block."

Figure 3:
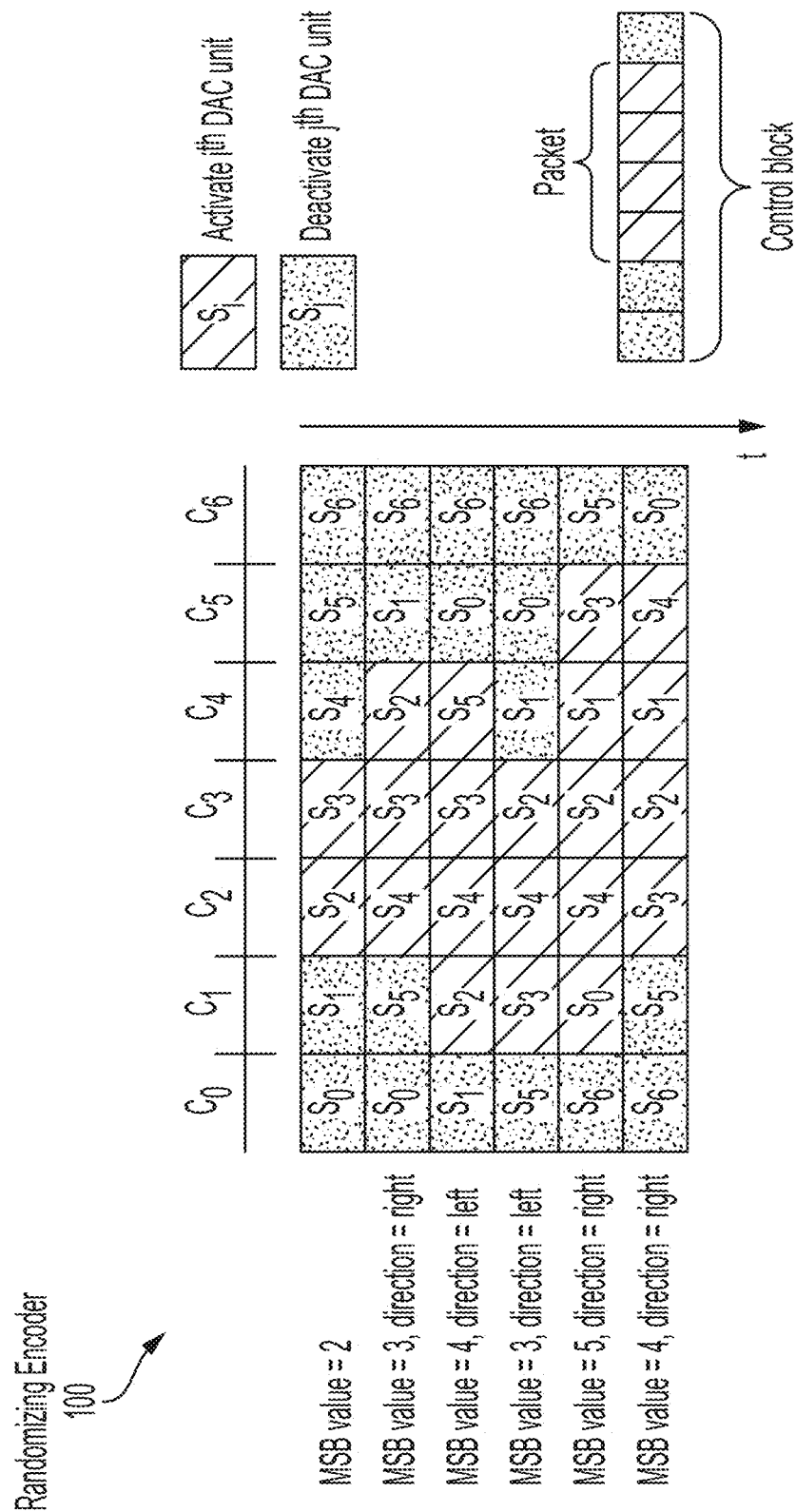
FIG. 3 is a schematic diagram illustrating the operation of the randomizing encoder of FIG. 1, in accordance with some embodiments of the technology described herein.

FIG. 3 is a schematic diagram illustrating the operation of randomizing encoder 100. This diagram illustrates how the bits of the control block are associated with the various switches of DAC 104. Where the entry corresponding to bit $C_i$ includes $S_k$, that indicates that bit $C_i$ controls the state of switch $S_k$. For example, switch $S_k$ is set to be open where $C_i=0$, and is set to be closed where $C_i=1$ (or vice versa).

Initially, in FIG. 3, the control block is arranged so that bit $C_0$ controls the state of switch $S_0$, bit $C_1$ controls the state of switch $S_1$, bit $C_2$ controls the state of switch $S_2$, bit $C_3$ controls the state of switch $S_3$, bit $C_4$ controls the state of switch $S_4$, bit $C_5$ controls the state of switch $S_5$, and bit $C_6$ controls the state of switch $S_6$ (see first row of the chart of FIG. 3). The way bits of the control block are associated with switches varies over time (see additional rows of the chart of FIG. 3).

The entries of the control block indicate whether the associated switches are to be activated (closed) or deactivated (opened). The entries are represented in FIG. 3 based on the shading of the bit. As shown in the legend appearing in the upper right corner of FIG. 3, one type of shading indicates that the corresponding switch is to be activated, the other type of shading indicates that the corresponding switch is to be activated. As further shown in the inset appearing in the lower right corner of FIG. 3, entries indicating that the corresponding switches are to be activated may be contiguous to one another—these entries are referred to as a "packet." The entries of the control block that are inside the packet indicate that the corresponding switches are to be activated; the entries of the control block that are outside the packet indicate that the corresponding switches are to be deactivated. It should be noted that the opposite logic is also possible in some embodiments (the entries of the control block that are inside the packet indicate that the corresponding switches are to be deactivated; the entries of the control block that are outside the packet indicate that the corresponding switches are to be activated). The width of the packet and the positioning of the packet with respect to the entries of the control block vary over time depending upon the value of the MSB bits.

III. Randomization of the Direction of Packet Contraction or Expansion

The different rows of the chart of FIG. 3 represent different time intervals. Each time interval may correspond to one clock cycle, or more than one clock cycle. Initially, in the time interval corresponding to the first row of FIG. 3, the MSB bits represent a value equal to 2. This sets the width of the packet to 2 bits. In this time interval, switches $S_2$ and $S_3$ are to be activated, and all the other switches are to be deactivated. As the value of the MSB bits changes over time, the packet expands or contracts. The direction in which the packet is expanded or contracted (left or right) may be selected in a random fashion, for example based on a random number or a pseudo random number.

In the time interval corresponding to the second row of FIG. 3, the value represented by MSB bits changes from 2 to 3. This leads to an expansion of the width of the packet from 2 bits to 3 bits. Whether the expansion occurs on the left or on the right is randomized. In this example, the randomization process leads to an expansion towards the right.

In the time interval corresponding to the third row of FIG. 3, the value represented by MSB bits changes from 3 to 4. This leads to another expansion of the width of the packet, from 3 bits to 4 bits. Again, whether the expansion occurs on the left or on the right is randomized. This time, the randomization process leads to an expansion towards the left.

In the time interval corresponding to the fourth row of FIG. 3, the value represented by MSB bits changes from 4 back to 3. This leads to a contraction of the width of the packet from 4 bits to 3 bits. Whether the contraction occurs on the left or on the right is randomized. Here, the randomization process leads to a contraction towards the left.

In the time interval corresponding to the fifth row of FIG. 3, the value represented by MSB bits changes from 3 to 5. This leads to yet another expansion of the width of the packet, from 3 bits to 5 bits. Here, the randomization process leads to an expansion towards the right.

Lastly, in the time interval corresponding to the sixth row of FIG. 3, the value represented by MSB bits changes from 5 back to 4. This leads to another contraction of the width of the packet, from 5 bits to 4 bits. Here, the randomization process leads to a contraction towards the right.

In some embodiments, the direction of expansion or contraction may be changed every n samples, where n is a fixed number, or a random or pseudo random number. In one example of a randomized n, the direction of contraction or expansion may be set to the left for three time intervals initially, may then be set to the right for four time intervals, may then be set back to the left for two time intervals, etc.

Over time, the process of randomizing the direction of the packet expansion or contraction distributes the current source mismatch more evenly across the entries of the control block, thus reducing its negative effects and increasing the SNR of the DAC.

IV. Swapping

In addition (or in alternative) to randomizing the direction of the packet expansion or contraction, another type of randomization may be performed as part of randomizing encoder 100. This randomization process involves swapping pairs of values in a packet (and/or pairs of values outside the packet) with one another. The rationale behind the randomized swapping is that it does not matter which particular current sources drive current, so long as the overall number of current sources that drive current remains constant and that the pairs of values swapped had the same state at the time they were swapped. What drives this randomization process is the input data itself, as opposed to a random number or pseudo random number.

Referring again to the time interval corresponding to the second row of FIG. 3, the location of the switches corresponding to the opposite boundaries of the packet are swapped with one another. Without the swapping, bit $C_2$ (at the left boundary of the packet) would continue to control switch $S_2$, and bit $C_4$ (at the right boundary of the packet) would continue to control switch $S_4$. After the swapping, bit $C_2$ controls switch $S_4$, and bit $C_4$ controls switch $S_2$. In addition, the location of the switches located outside the package and immediately adjacent to the opposite boundaries of the packet are also swapped with one another. Without the swapping, bit $C_1$ would continue to control switch $S_1$, and bit $C_5$ would continue to control switch $S_5$. After the swapping, bit $C_1$ controls switch $S_5$, and bit $C_5$ controls switch $S_1$.

Referring again to the time interval corresponding to the third row of FIG. 3, the location of the switches corresponding to the opposite boundaries of the packet are swapped again with one another. Without the swapping, bit $C_1$ would continue to control switch $S_5$, and bit $C_4$ would continue to control switch $S_2$. After the swapping, bit $C_1$ controls switch $S_2$, and bit $C_4$ controls switch $S_5$. In addition, the location of the switches located outside the package and immediately adjacent to the opposite boundaries of the packet are also swapped with one another. Without the swapping, bit $C_0$ would continue to control switch $S_0$, and bit $C_5$ would continue to control switch $S_1$. After the swapping, bit $C_0$ controls switch $S_1$, and bit $C_5$ controls switch $S_0$.

Referring again to the time interval corresponding to the fourth row of FIG. 3, the location of the switches corresponding to the opposite boundaries of the packet are swapped again with one another. Without the swapping, bit $C_1$ would continue to control switch $S_2$, and bit $C_3$ would continue to control switch $S_3$. After the swapping, bit $C_1$ controls switch $S_3$, and bit $C_3$ controls switch $S_2$. In addition, the location of the switches located outside the package and immediately adjacent to the opposite boundaries of the packet are also swapped with one another. Without the swapping, bit $C_0$ would continue to control switch $S_1$, and bit $C_4$ would continue to control switch $S_5$. After the swapping, bit $C_0$ controls switch $S_5$, and bit $C_4$ controls switch $S_1$.

Referring again to the time interval corresponding to the fifth row of FIG. 3, the location of the switches corresponding to the opposite boundaries of the packet are swapped again with one another. Without the swapping, bit $C_1$ would continue to control switch $S_3$, and bit $C_5$ would continue to control switch $S_0$. After the swapping, bit $C_1$ controls switch $S_0$, and bit $C_5$ controls switch $S_3$. In addition, the location of the switches located outside the package and immediately adjacent to the opposite boundaries of the packet are also swapped with one another. Without the swapping, bit $C_0$ would continue to control switch $S_5$, and bit $C_6$ would continue to control switch $S_6$. After the swapping, bit $C_0$ controls switch $S_6$, and bit $C_6$ controls switch $S_5$.

Lastly, referring again to the time interval corresponding to the sixth row of FIG. 3, the location of the switches corresponding to the opposite boundaries of the packet are swapped again with one another. Without the swapping, bit $C_2$ would continue to control switch $S_4$, and bit $C_5$ would continue to control switch $S_3$. After the swapping, bit $C_2$ controls switch $S_3$, and bit $C_5$ controls switch $S_4$. In addition, the location of the switches located outside the package and immediately adjacent to the opposite boundaries of the packet are also swapped with one another. Without the swapping, bit $C_1$ would continue to control switch $S_0$, and bit $C_6$ would continue to control switch $S_5$. After the swapping, bit $C_1$ controls switch $S_5$, and bit $C_6$ controls switch $S_0$.

The choice of location of the switches corresponding to the opposite boundaries of the packet being swapped is an arbitrary choice for convenience of implementation. One could for example choose to swap one boundary switch with another switch that is closest to the center of the control packet. Likewise, a boundary switch could be chosen to be swapped with another switch that is closest to the center of those not in the control packet.

It should be clear that there are swapping exceptions if the control packet has less than 2 switches, where no swapping can occur inside the control packet. Likewise, there are swapping exceptions if the control packet has more than 5 switches, where no swapping can occur outside the control packet.

V. Randomization of the Swapping

In some embodiments, whether or not the swapping described above is performed is itself randomized. This randomization may be performed on the basis of a random number or a pseudo random number. This random number or a pseudo random number may be the same used in connection with the randomization of the direction of packet expansion or contraction, or a different one.

For example, swapping may be performed in the time intervals corresponding to the second and fifth rows of FIG. 3, but may not be performed in the time intervals corresponding to the third, fourth and sixth rows. Again, whether swapping is to be performed in a particular time interval is randomized.

In some embodiments, swapping may be performed every n time intervals, where n is a fixed number or a random or pseudo random number.

VI. Conclusion

Accordingly, some embodiments relate to a method for performing digital-to-analog conversion (DAC). The method comprises receiving an input digital word (e.g., $B_0$, $B_1$, $B_2$, $B_3$, $B_4$, $B_5$, $B_6$, $B_7$, $B_8$, $B_9$, $B_{10}$ and $B_{11}$). The method further comprises encoding at least a portion of the input digital word (e.g., the MSB) using a randomizing encoder (e.g., 102). The randomizing encoder may comprise a plurality of outputs coupled to a plurality of DAC units (e.g., DAC units 105). The state of each of the plurality of outputs (e.g., whether 0 or 1) may be set by a corresponding entry of a control block (see FIG. 3). Encoding at least a portion of the input digital word, in turn, may comprise generating a packet by setting at least some of the entries of the control block (see FIG. 3). Setting at least some of the entries comprises setting a width of the packet based on a value represented by the at least a portion of the input digital word. Further, the packet may be modified based on a change in the value represented by the at least a portion of the input digital word (e.g., from 2 to 3, as shown in the second row of FIG. 3). Modifying the packet comprises varying the width of the packet either in a first direction (e.g., left) or a in second direction (e.g., right) depending on a random number or a pseudo random number. Lastly, the plurality of DAC units may be controlled based on the packet at a first time interval (e.g., corresponding to a row of FIG. 3), and may again be controlled based on the modified packet at a second time interval subsequent the first time (e.g., corresponding to a subsequent row of FIG. 3).

Figure 4B:
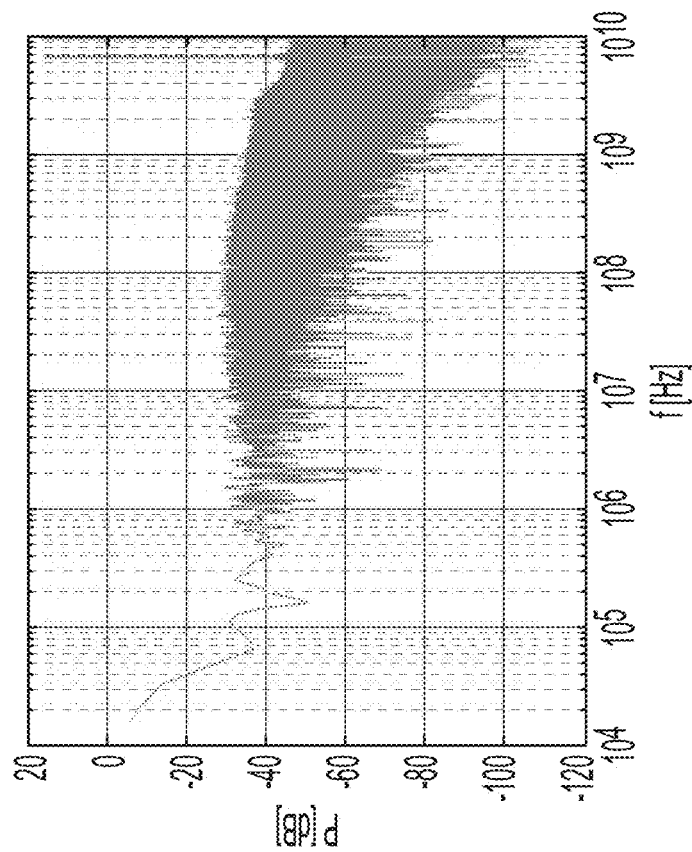
FIG. 4B is a plot illustrating the spectrum of the output of a DAC suffering switch timing error or errors in DC linearity, where the DAC is encoded using a randomizing encoder, in accordance with some embodiments of the technology described herein.
Figure 4A:
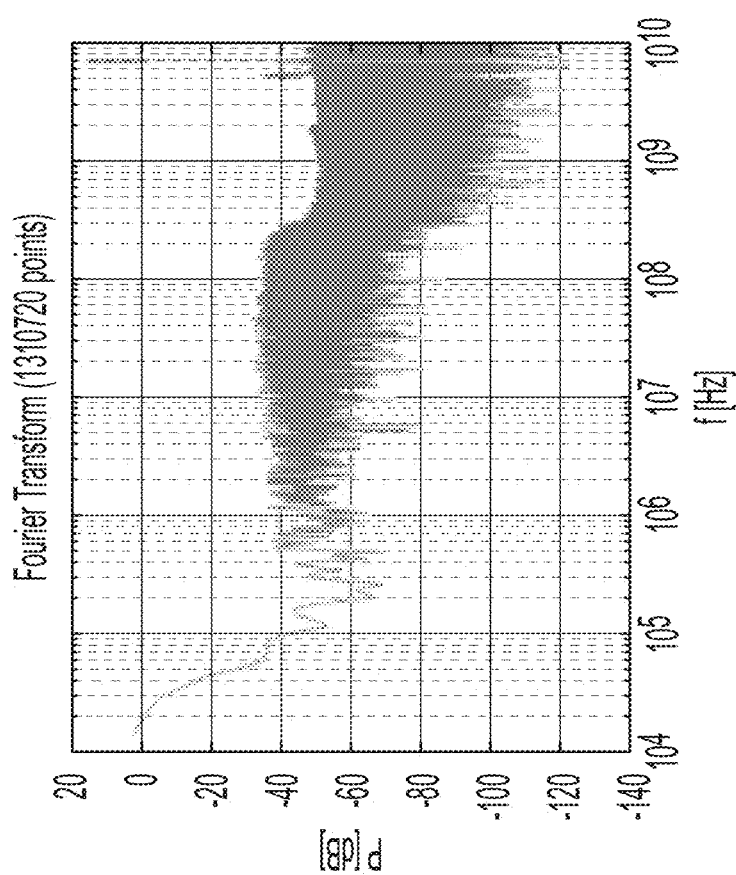
FIG. 4A is a plot illustrating the spectrum of the output of a DAC suffering from switch timing error or errors in DC linearity, in accordance with some embodiments of the technology described herein.

FIGS. 4A-4B are presented as examples to illustrate the positive effects of the randomizing encoders described herein. FIG. 4A is a plot illustrating the spectrum of the output of a DAC suffering switch timing error or errors in DC linearity. On the other hand, FIG. 4B is a plot illustrating the spectrum of the output of a DAC suffering from switch timing error or errors in DC linearity, where the DAC is encoded using a randomizing encoder of the types described herein. In both examples, the spectra present a peak at around 7 GHz—the frequency corresponding to the first harmonic of the signal. In the example of FIG. 4A, where the DAC is not compensated for mismatch, the spectrum of the noise is relatively flat in the region between 500 MHz and 10 GHz. However, compensating the mismatch in the manner described herein leads to a negative slope in the noise spectrum. This means that spurious content created by the timing errors is pushed towards lower frequencies, away from the bandwidth of interest Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±10% of a target value in some embodiments. The terms "approximately" and "about" may include the target value.

What is claimed is:

1. A method for performing digital-to-analog conversion (DAC), comprising:
   receiving an input digital word;
   encoding at least a portion of the input digital word using a randomizing encoder, wherein the randomizing encoder comprises a plurality of outputs coupled to a plurality of DAC units, a state of each of the plurality of outputs being set by a corresponding entry of a control block, and wherein encoding at least a portion of the input digital word comprises:
      generating a packet by setting at least some of the entries of the control block, wherein setting at least some of the entries comprises setting a width of the packet based on a value represented by the at least a portion of the input digital word; and
      modifying the packet based on a change in the value represented by the at least a portion of the input digital word, wherein modifying the packet comprises varying the width of the packet either in a first direction or a in second direction depending on a random number or a pseudo random number; and
   controlling the plurality of DAC units based on the packet at a first time interval, and controlling the plurality of DAC units based on the modified packet at a second time interval subsequent the first time interval.

2. The method of claim 1, wherein encoding at least a portion of the input digital word using a randomizing encoder comprises encoding most significant bits (MSB) of the input digital word using the randomizing encoder.

3. The method of claim 2, further comprising encoding least significant bits (LSB) of the input digital word using a binary encoder distinct from the randomizing encoder.

4. The method of claim 1, wherein controlling the plurality of DAC units based on the packet comprises:
   activating a first set of DAC units as associated with entries of the packet; and
   deactivating a second set of DAC units as associated with entries of the control block outside the packet.

5. The method of claim 1, wherein modifying the packet further comprises swapping a first entry of the packet with a second entry of the packet.

6. The method of claim 5, wherein the first entry and the second entry of the control block are boundary entries of the packet.

7. The method of claim 1, wherein encoding at least a portion of the input digital word further comprises swapping a first entry of the control block outside the packet with a second entry of the control block outside the packet.

8. The method of claim 7, wherein the first entry and the second entry of the control block are adjacent opposite ends of the packet, respectively.

9. The method of claim 1, wherein modifying the packet occurs every n samples, where n represents a randomized or fixed number of samples.

10. The method of claim 1, further comprising changing a direction from the first direction to the second direction every n samples, where n represents a randomized or fixed number of samples.

11. The method of claim 1, further comprising deciding whether to modify the packet every n samples, where n represents a randomized or fixed number of samples, in accordance with a random binary decision.

12. A system for performing digital-to-analog conversion (DAC), comprising:
   a plurality of DAC units; and
   a randomizing encoder comprising a plurality of outputs coupled to the plurality of DAC units, a state of each of the plurality of outputs being set by a corresponding entry of a control block, wherein the randomizing encoder is configured to:
      receive an input digital word;
      encode at least a portion of the input digital word by:
         generating a packet by setting at least some of the entries of the control block, wherein setting at least some of the entries comprises setting a width of the packet based on a value represented by the at least a portion of the input digital word; and
         modifying the packet based on a change in the value represented by the at least a portion of the input digital word, wherein modifying the packet comprises varying the width of the packet either in a first direction or a in second direction depending on a random number or a pseudo random number; and
      control the plurality of DAC units based on the packet at a first time interval, and control the plurality of DAC units based on the modified packet at a second time interval subsequent the first time interval.

13. The system of claim 12, wherein encoding at least a portion of the input digital word comprises encoding most significant bits (MSB) of the input digital word.

14. The system of claim 13, further comprising a binary encoder, distinct from the encoder, configured to encode least significant bits (LSB) of the input digital word.

15. The system of claim 12, wherein controlling the plurality of DAC units based on the packet comprises:
   activating a first set of DAC units as associated with entries of the packet; and
   deactivating a second set of DAC units as associated with entries of the control block outside the packet.

16. The system of claim 12, wherein modifying the packet further comprises swapping a first entry of the packet with a second entry of the packet.

17. The system of claim 12, wherein encoding at least a portion of the input digital word further comprises swapping a first entry of the control block outside the packet with a second entry of the control block outside the packet.

18. A method for performing digital-to-analog conversion (DAC), comprising:
receiving an input digital word;
encoding at least a portion of the input digital word using a randomizing encoder, wherein the randomizing encoder comprises a plurality of outputs coupled to a plurality of DAC units, a state of each of the plurality of outputs being set by a corresponding entry of a control block, and wherein encoding at least a portion of the input digital word comprises:
generating a packet by setting at least some of the entries of the control block, wherein setting at least some of the entries comprises setting a width of the packet based on a value represented by the at least a portion of the input digital word; and
modifying the packet based on a change in the value represented by the at least a portion of the input digital word, wherein modifying the packet comprises swapping a first entry of the packet with a second entry of the packet; and
controlling the plurality of DAC units based on the packet at a first time interval, and controlling the plurality of DAC units based on the modified packet at a second time interval subsequent the first time interval.

19. The method of claim 18, wherein encoding at least a portion of the input digital word using a randomizing encoder comprises encoding most significant bits (MSB) of the input digital word using the randomizing encoder.

20. The method of claim 18, wherein the first entry of the packet and the second entry of the packet are boundary entries of the packet.

\* \* \* \* \*